(12) United States Patent
Sone

(10) Patent No.: US 9,424,918 B2
(45) Date of Patent: Aug. 23, 2016

(54) IONIC STORAGE UNIT AND DRIVING METHOD

(71) Applicant: Sony Corporation, Tokyo (JP)

(72) Inventor: Takeyuki Sone, Kanagawa (JP)

(73) Assignee: Sony Corporation, Tokyo (JP)

( * ) Notice: Subject to any disclaimer, the term of this patent is extended or adjusted under 35 U.S.C. 154(b) by 91 days.

(21) Appl. No.: 13/960,519

(22) Filed: Aug. 6, 2013

(65) Prior Publication Data

US 2014/0050011 A1    Feb. 20, 2014

(30) Foreign Application Priority Data

Aug. 15, 2012    (JP) ................................. 2012-180285

(51) Int. Cl.
*G11C 13/00*      (2006.01)

(52) U.S. Cl.
CPC ........ *G11C 13/0069* (2013.01); *G11C 13/0097* (2013.01); *G11C 2013/0083* (2013.01); *G11C 2213/79* (2013.01)

(58) Field of Classification Search
CPC ........... G11C 13/0002; G11C 13/0011; G11C 13/0009; G11C 13/004; G11C 13/0069; G11C 13/0097; G11C 2013/0083
USPC .................. 365/148, 163, 100; 257/E45.002, 257/E45.003
See application file for complete search history.

(56) References Cited

U.S. PATENT DOCUMENTS

| 8,531,863 | B2 * | 9/2013 | Symanczyk et al. | .......... 365/148 |
| 8,787,065 | B2 * | 7/2014 | Torsi | .............. 365/148 |
| 8,902,629 | B2 * | 12/2014 | Kawai | ........... H01L 27/101 365/148 |
| 2006/0265548 | A1 * | 11/2006 | Symanczyk et al. | .......... 711/106 |
| 2011/0194329 | A1 * | 8/2011 | Ohba et al. | ................. 365/148 |
| 2012/0230085 | A1 * | 9/2012 | Kawai | ........... H01L 27/101 365/148 |
| 2013/0107605 | A1 * | 5/2013 | Chen | ............................ 365/148 |
| 2013/0250651 | A1 * | 9/2013 | Sills | ............................. 365/148 |
| 2013/0286714 | A1 * | 10/2013 | Takagi et al. | .................. 365/148 |

FOREIGN PATENT DOCUMENTS

| JP | 2002-536840 | 10/2001 |
| JP | 2005-197634 | 7/2005 |

* cited by examiner

*Primary Examiner* — Son Dinh
*Assistant Examiner* — Jerome Leboeuf
(74) *Attorney, Agent, or Firm* — Chip Law Group

(57) ABSTRACT

There is provided a storage unit including: a storage device configured to store a resistance state, the resistance state being changeable between a first state and a second state; and a driving section, when setting the resistance state to the first state, applying a first pulse having a first polarity to the storage device, the driving section, when setting the resistance state to the second state, applying a second pulse having a second polarity to the storage device, then temporarily applying a third pulse having the first polarity, and applying the second pulse again, the first polarity and the second polarity differing from each other.

16 Claims, 13 Drawing Sheets

IONIC STORAGE UNIT AND DRIVING METHOD

BACKGROUND

The present disclosure relates to a storage unit provided with a storage device that holds information with use of a variable resistance property, and a method of driving such a storage unit.

For information apparatuses such as computers, dynamic random access memories (DRAMs) with a high-speed operation and a high density have been widely used as random access memories. Unfortunately, DRAMs involve increased manufacturing costs, because their manufacturing process is more complex than that of typical large scale integrated circuits (LSIs) in a logic circuit or signal processing circuit for use in an electronic apparatus. Moreover, since DRAMs are volatile memories in which information is lost when the power is switched off, they have to undergo frequent refresh operations. Each refresh operation includes: reading written information (data) from a DRAM: amplifying the information again; and rewriting the information to the DRAM.

Meanwhile, in recent years, nonvolatile memories have been increasingly used, in which information is not lost even when the power is switched off. The use of nonvolatile memories is expected to reduce the power consumption, because no refresh operation is necessary. Various types of storage devices to be used with nonvolatile memories have been developed so far. One example is a so-called resistance change type of storage device, which holds information with use of a variable resistance property. Certain resistance change types of storage devices have a relatively simple structure, and are advantageous to overcome the limitation of the microfabrication. For example, Japanese Unexamined Patent Application Publication (Translation of PCT Application) No. 2002-536840 discloses a resistance change type of storage device having a structure in which an ion conductor containing a predetermined metal is sandwiched between two electrodes. In addition, Japanese Unexamined Patent Application Publication No. 2005-197634 discloses a resistance change type of storage device that is capable of stably retaining information over an extended period or under the condition of a high-temperature environment.

SUMMARY

On the other hand, nonvolatile memories are expected to realize many rewritable times. Specifically, resistance change types of storage devices are expected to sufficiently secure a difference in resistance between high and low resistance states, even when the information is rewritten.

It is desirable to provide a storage unit that is capable of increasing the number of its rewritable times, and a driving method.

According to an embodiment of the present disclosure, there is provided a storage unit including: a storage device configured to store a resistance state, the resistance state being changeable between a first state and a second state; and a driving section, when setting the resistance state to the first state, applying a first pulse having a first polarity to the storage device, the driving section, when setting the resistance state to the second state, applying a second pulse having a second polarity to the storage device, then temporarily applying a third pulse having the first polarity, and applying the second pulse again, the first polarity and the second polarity differing from each other.

According to an embodiment of the present disclosure, there is provided a driving method including: when setting a resistance state of a storage device to a first state, applying a first pulse having a first polarity to the storage device, the resistance state being changed between the first state and a second state; and when setting the resistance state to the second state, applying a second pulse having a second polarity to the storage device, then temporarily applying a third pulse having the first polarity, and applying the second pulse again, the first polarity and the second polarity differing from each other.

In the storage unit and the driving method according to the respective embodiments of the present disclosure, the driving section applies a pulse to the storage device, and therefore the resistance state of the storage device is set to the first state or the second state. Specifically, when the resistance state of the storage device is set to the second state, the driving section applies the second pulse having the second polarity to the storage device, then temporarily applies the third pulse having the first polarity, and applies the second pulse again.

According to the storage unit and the driving method of the respective embodiments of the present disclosure, when the resistance state of the storage device is set to the second state, the second pulse having the second polarity is applied to the storage device, then the third pulse having the first polarity is temporarily applied to the storage device, and the second pulse is applied to the storage device again. With the above-described storage unit and storing method, the number of rewritable times is increased.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

Figure 5:
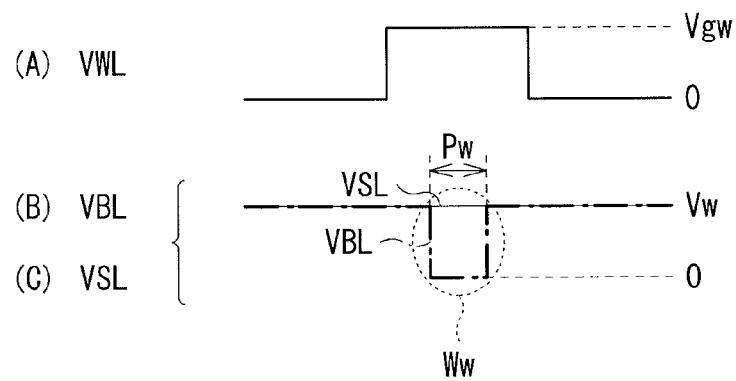

Parts (A), (B), and (C) of FIG. 5 are timing waveform diagrams illustrating an exemplary operation in a writing process.

Figure 6:
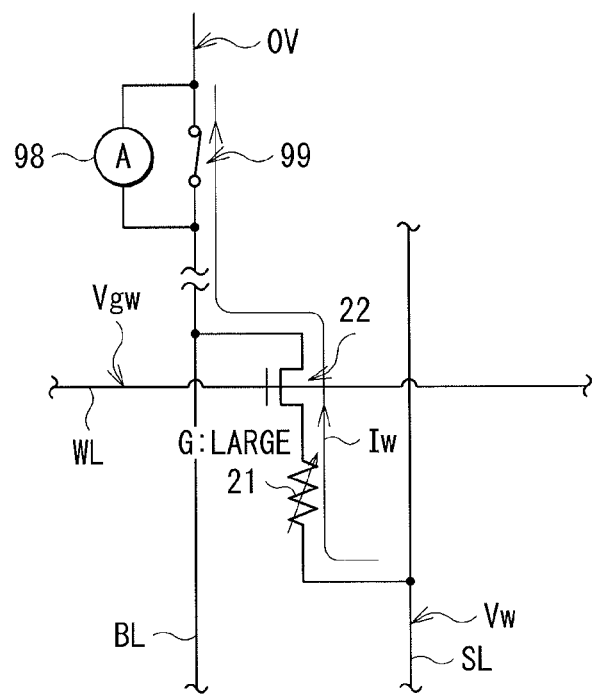

FIG. 6 is an explanatory diagram illustrating a state of the memory cell in the writing process.

Figure 7:
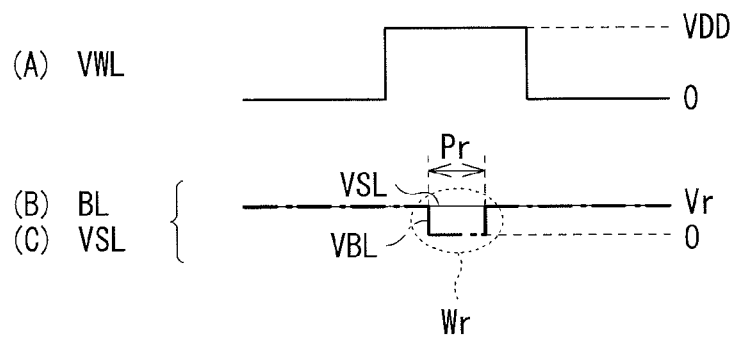

Parts (A), (B), and (C) of FIG. 7 are timing waveform diagrams illustrating an exemplary operation in a reading process.

Figure 8:
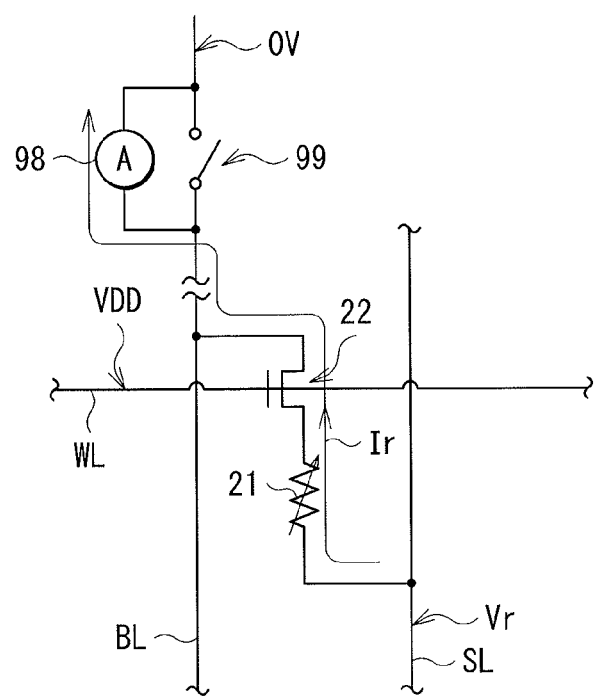

FIG. 8 is an explanatory diagram illustrating a state of the memory cell in the reading process.

Figure 9:
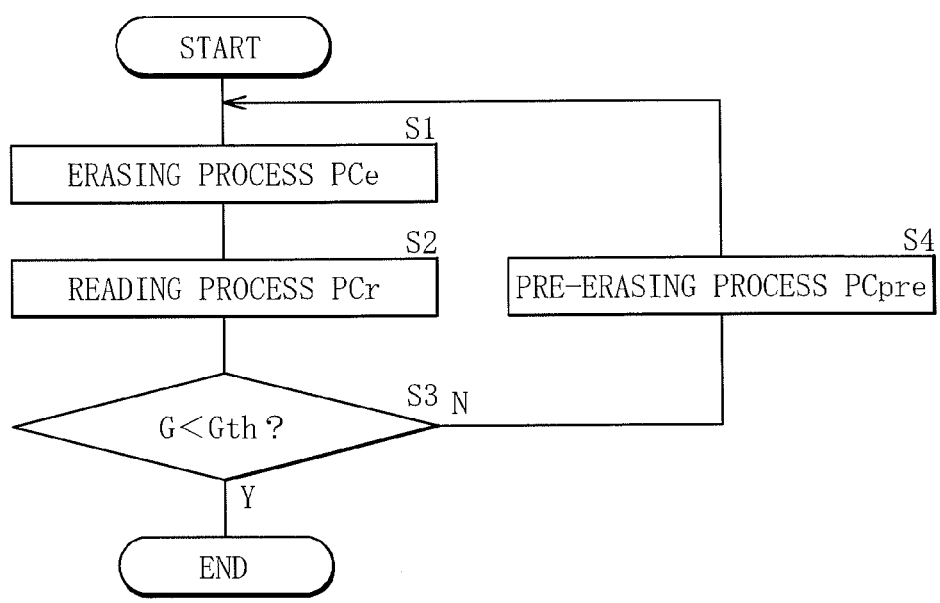

FIG. 9 is a flowchart illustrating an exemplary operation in an erasing operation.

Figure 10:
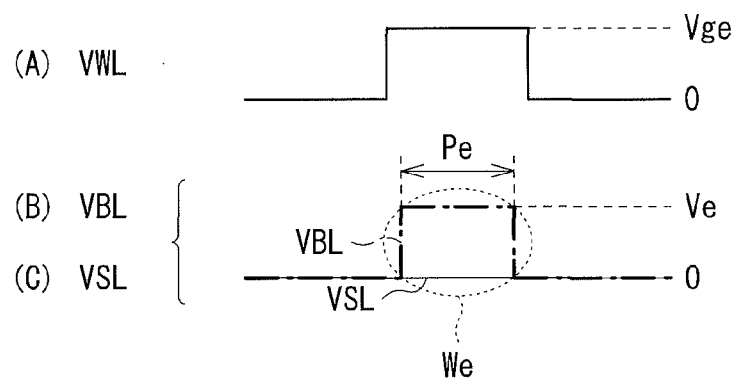

Parts (A), (B), and (C) of FIG. 10 are timing waveform diagrams illustrating an exemplary operation in an erasing process.

Figure 11:
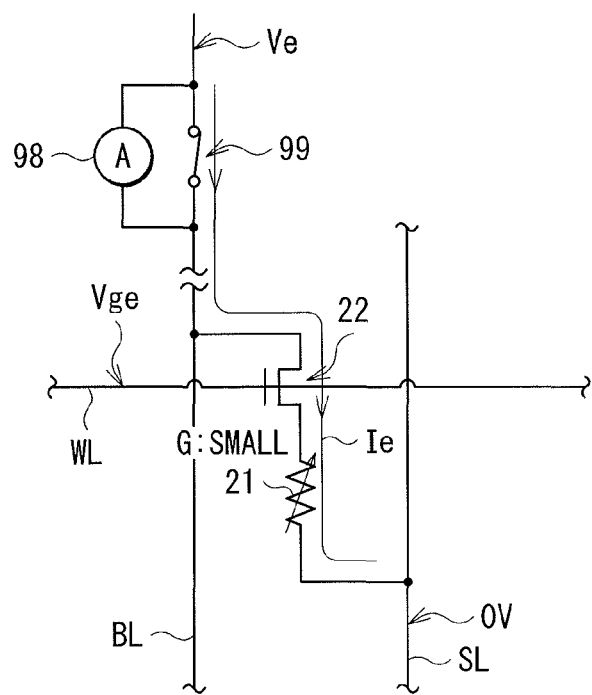

FIG. 11 is an explanatory diagram illustrating a state of the memory cell in the erasing process.

Figure 12:
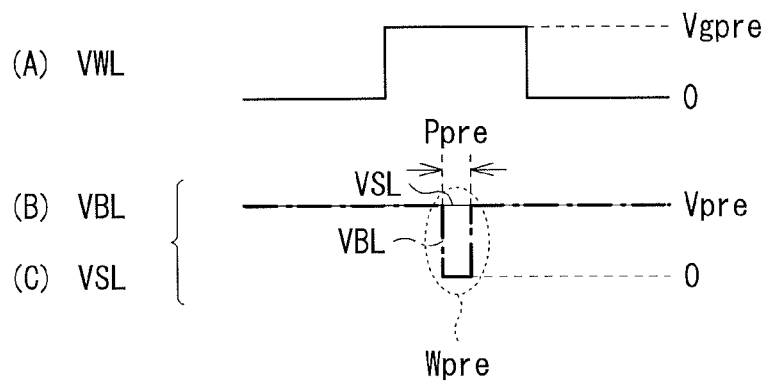

Parts (A), (B), and (C) of FIG. 12 are timing waveform diagrams illustrating an exemplary operation in a pre-erasing process.

Figure 13:
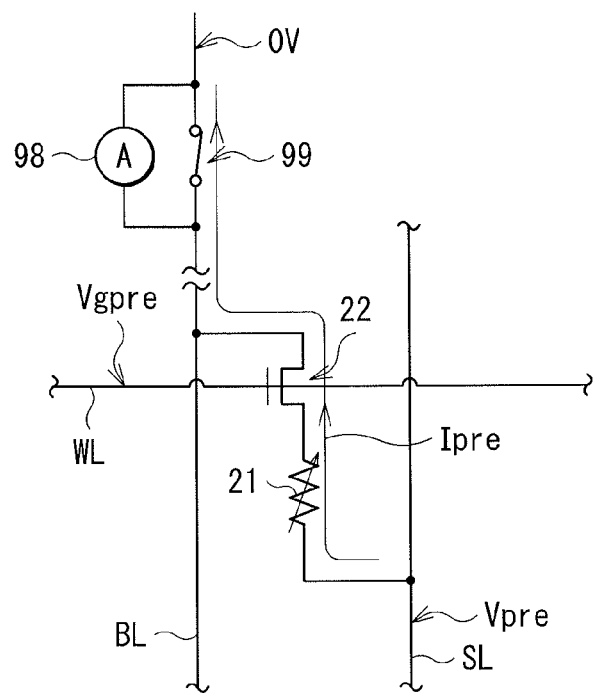

FIG. 13 is an explanatory diagram illustrating a state of the memory cell in the pre-erasing process.

Figure 14:
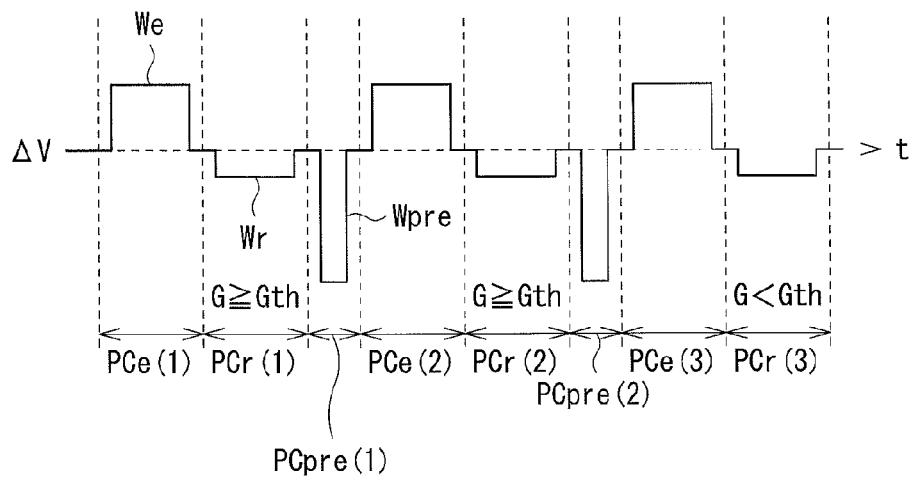

FIG. 14 is a timing waveform diagram illustrating an exemplary operation in the erasing operation in FIG. 9.

Figure 15:
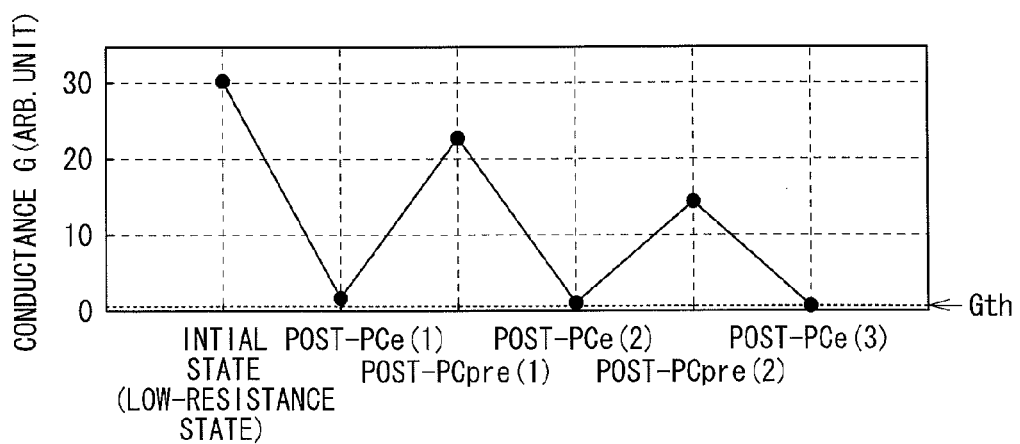

FIG. 15 is an explanatory diagram illustrating an exemplary operation in the erasing operation in FIG. 9.

Figure 1:
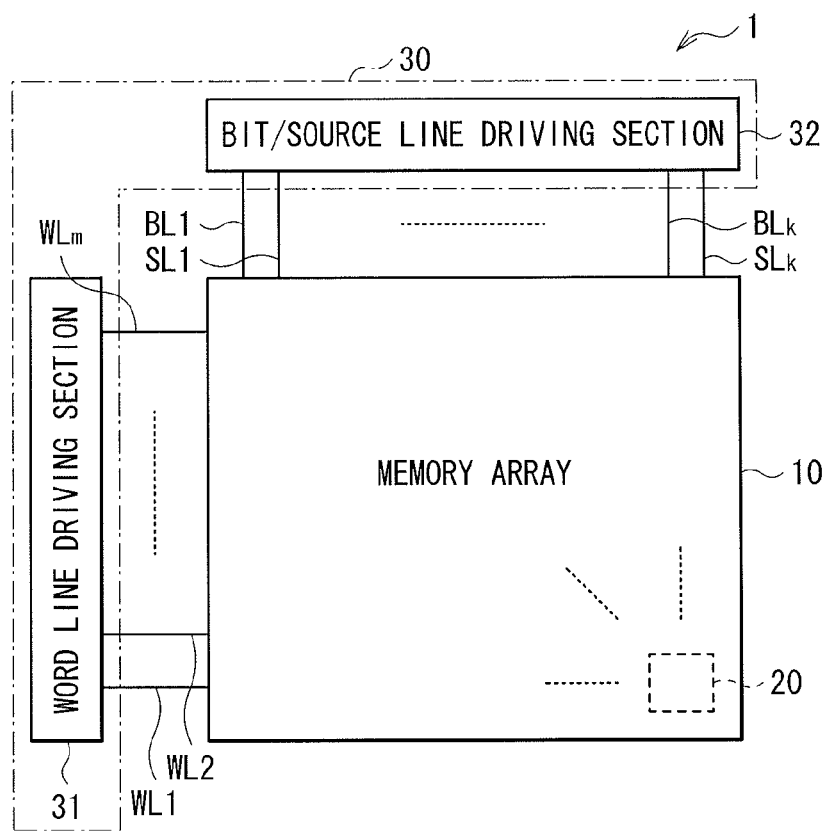
FIG. 1 is a block diagram illustrating an exemplary configuration of a storage unit according to an embodiment of the present disclosure.
Figure 16:
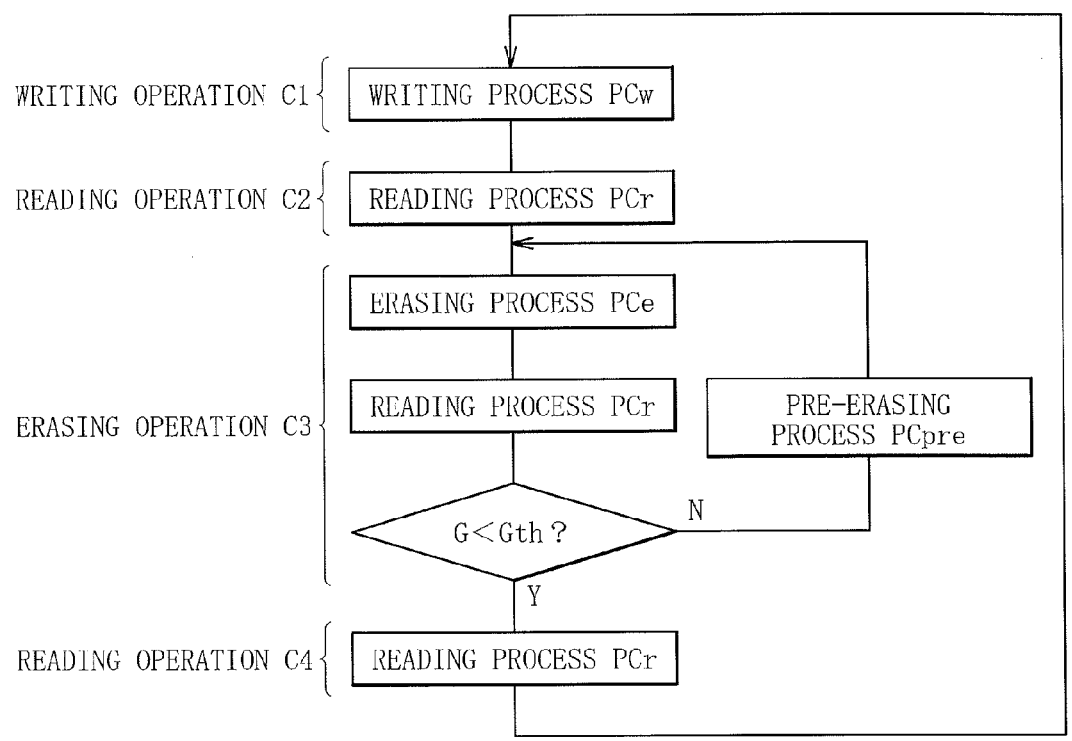

FIG. 16 is a flowchart illustrating an exemplary operation performed by the storage unit in FIG. 1.

Figure 17:
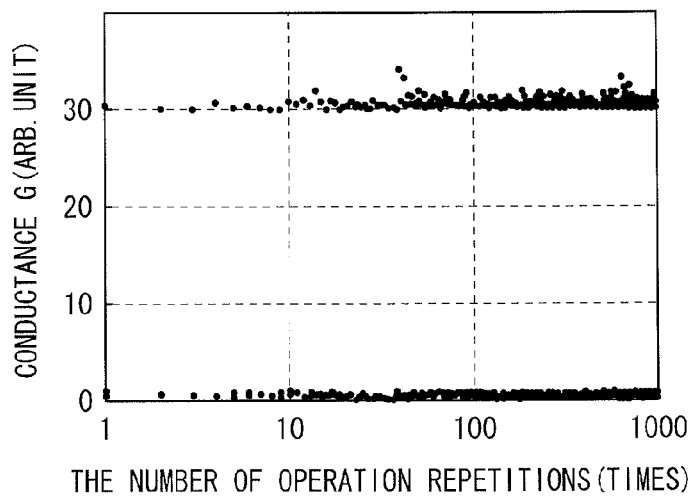

FIG. 17 is a characteristic diagram illustrating exemplary characteristics of the storage unit in FIG. 1.

Figure 18:
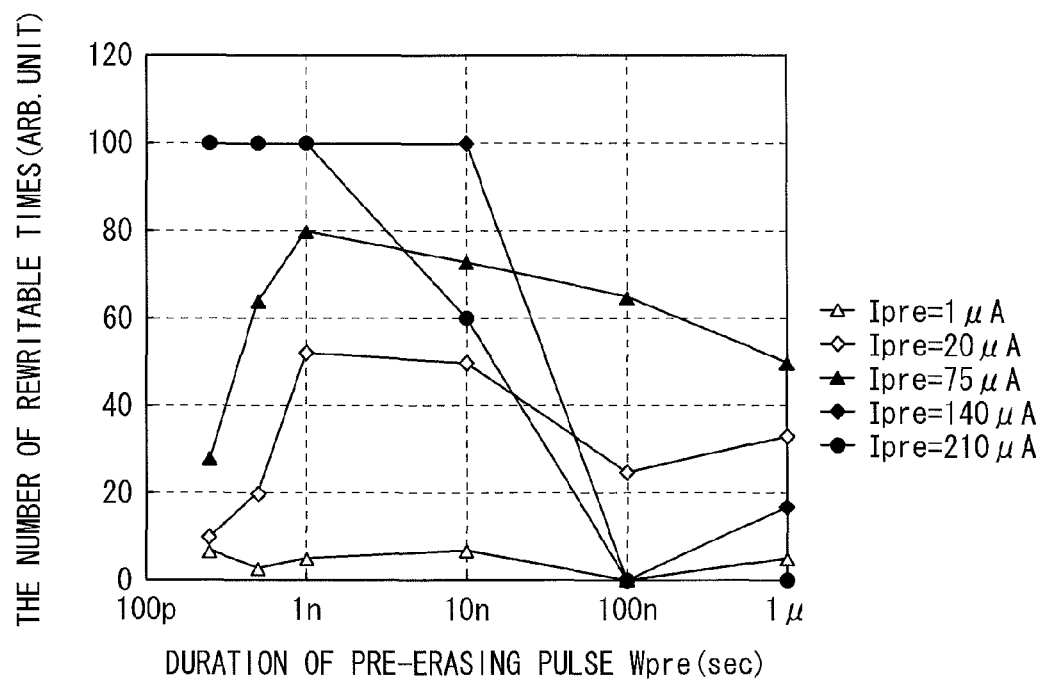

FIG. 18 is a characteristic diagram illustrating other exemplary characteristics of the storage unit in FIG. 1.

Figure 19:
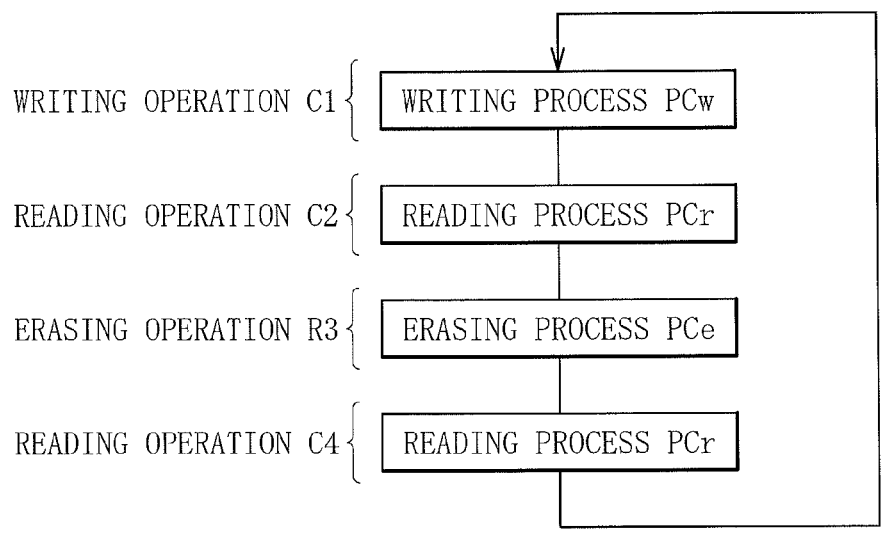

FIG. 19 is a flowchart illustrating an exemplary operation performed by a storage unit according to a comparative example of the embodiment.

Figure 20:
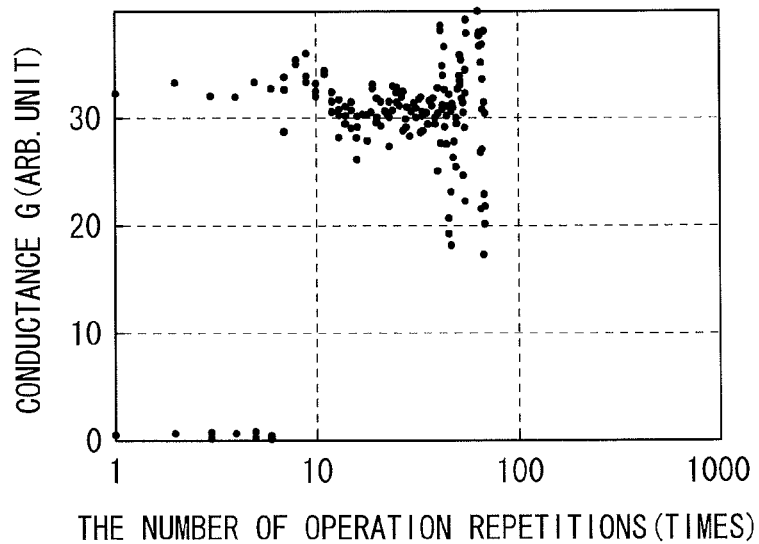

FIG. 20 is a characteristic diagram illustrating exemplary characteristics of the storage unit according to the comparative example of the embodiment.

Figure 21:
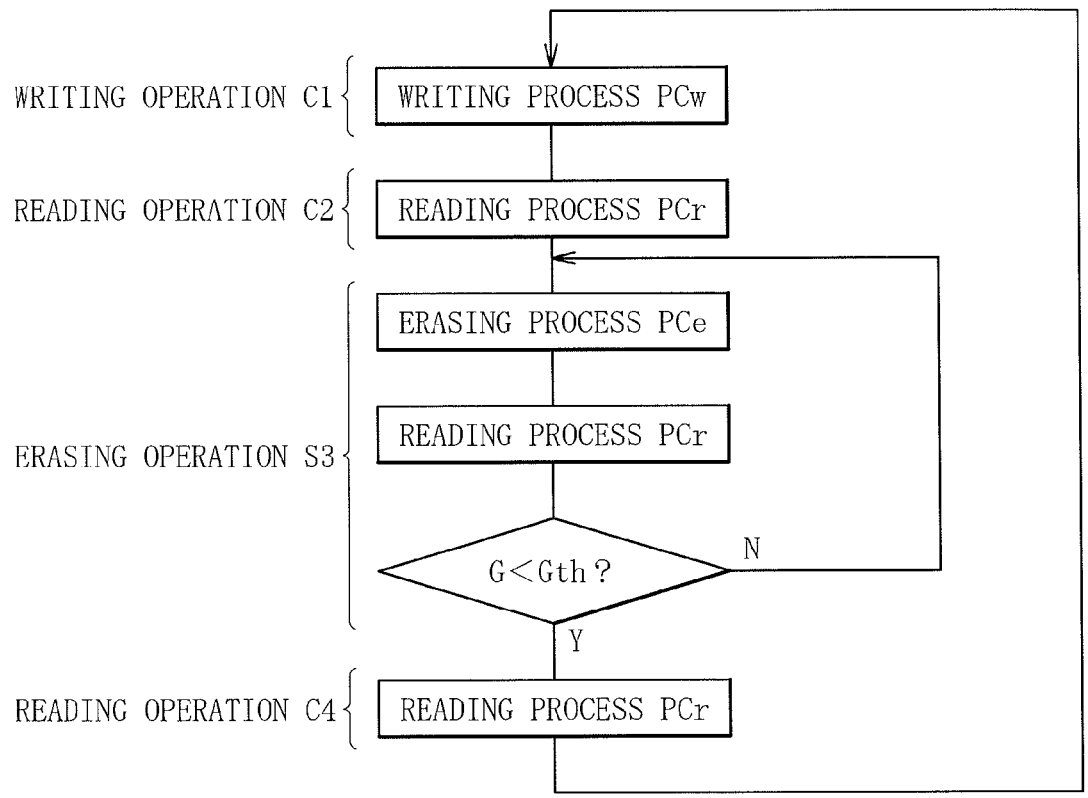

FIG. 21 is a flowchart illustrating an exemplary operation performed by a storage unit according to another comparative example of the embodiment.

Figure 22:
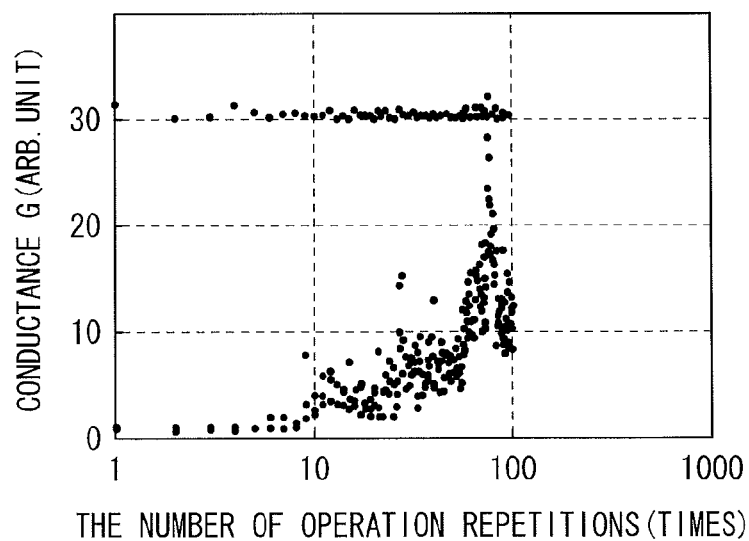

FIG. 22 is a characteristic diagram illustrating exemplary characteristics of the storage unit according to still another comparative example of the embodiment.

DETAILED DESCRIPTION

Hereinafter, an embodiment of the present disclosure will be described in detail, with reference to the accompanying drawings.

1. Embodiment

Exemplary Configuration

FIG. 1 depicts an exemplary configuration of a storage unit according to an embodiment. A storage unit 1 is provided with a resistance change type of storage devices. Note that a driving method according to an embodiment of the present disclosure is embodied by this embodiment. Therefore, the driving method will also be described below. The storage unit 1 includes a driving section 30 and a memory array 10.

The driving section 30 includes a word line driving section 31 and a bit/source line driving section 32, as depicted in FIG. 1.

The word line driving section 31 selects memory cells 20 (described later) to be driven in the memory array 10. In more detail, the word line driving section 31 applies a signal to a plurality of (in this case, an m (integer of 2 or more) number of) word lines WL (described later) of the memory array 10, thereby selecting the memory cells 20 to be driven.

The bit/source line driving section 32 selectively performs information writing, erasing, and reading operations on the memory cells 20 (described later) in the memory array 10 which are selected as driven targets. Specifically, the bit/source line driving section 32 applies a signal to a plurality of (in this case, a k (integer of 2 or more) number of) bit lines BL and source lines SL (both described later), thereby selectively performing information writing, erasing, and reading operations on the memory cells 20 in the memory array 10 which are selected as driven targets. In addition, the bit/source line driving section 32 is equipped with a sense amplifier (not depicted in the drawings), and has a function of amplifying information read from respective memory cells 20 through the bit lines BL (bit lines BL1 to BLk) with this sense amplifier, during the reading operation.

The memory array 10 retains information that has been written thereto by the driving section 30.

Figure 2:
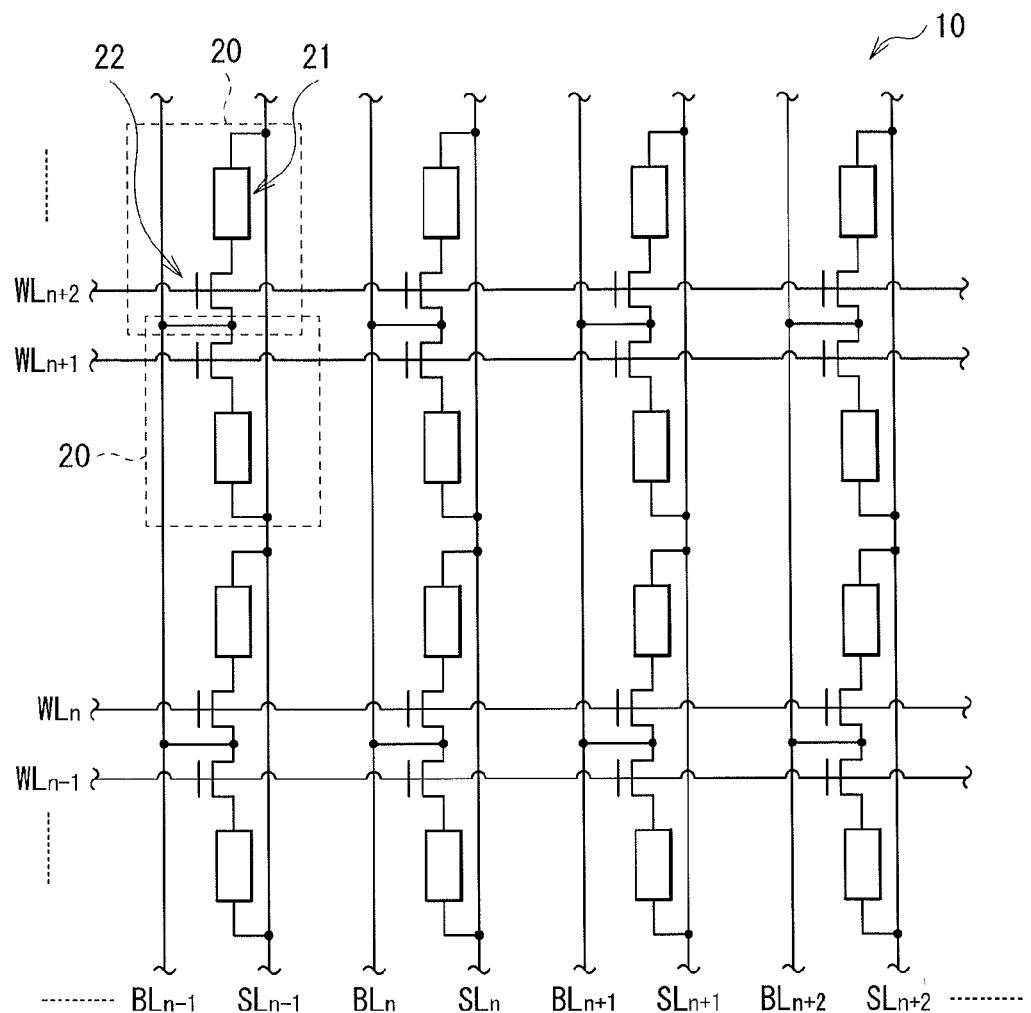
FIG. 2 is a circuit diagram illustrating an exemplary configuration of a memory array in FIG. 1.

FIG. 2 depicts an exemplary configuration of the memory array 10. The memory array 10 includes the plurality of memory cells 20 arranged in a matrix fashion. In addition, the memory array 10 has the plurality of word lines WL extending in a row (or lateral) direction, and the plurality of bit lines BL and source lines SL extending in a column (or vertical) direction. Respective one ends of the word lines WL, the bit lines BL, and the source lines SL are connected to the driving section 30.

Each memory cell 20 includes a storage device 21 and a selection transistor 22, and is connected to the corresponding word line WL, bit line BL, and source line SL.

Each storage device 21 holds information with use of a property in which its resistance state is reversibly changed (between a low-resistance state and a high-resistance state) according to an applied voltage. Both ends of each storage device 21 are connected to the corresponding selection transistor 22 and source line SL, respectively.

Each selection transistor 22 selects the storage device 21 to be driven, and may be configured of, for example, a metal oxide semiconductor (MOS) transistor. However, there is no limitation on the structure of the selection transistor 22. Alternatively, a transistor with a different structure may be used. A gate of each selection transistor 22 is connected to the corresponding word line WL, and one of a drain and a source of each selection transistor 22 is connected to an end of the corresponding storage device 21 whereas the other of the drain and the source thereof is connected to the corresponding bit line BL.

Figure 3:
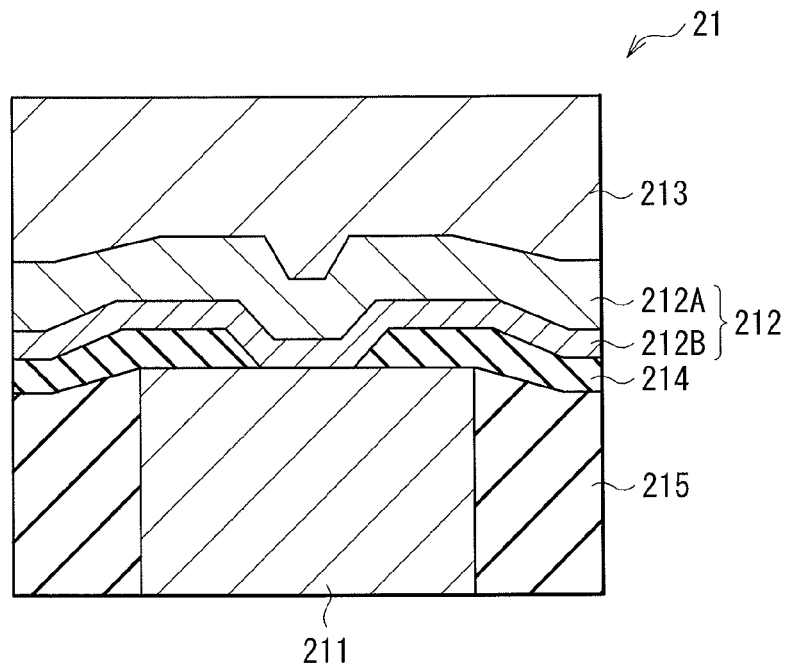
FIG. 3 is a cross-section view illustrating an exemplary configuration of a storage device in FIG. 2.

FIG. 3 depicts an exemplary schematic cross-section of the storage device 21. The storage device 21 is formed by stacking a lower electrode 211, a storage layer 212, and an upper electrode 213, in this order.

The lower electrode 211 is provided at an end of the storage device 21, and is connected to the selection transistor 22. In this example, the lower electrode 211 is formed so as to be surrounded by an insulating film 215. The lower electrode 211 may be made of, for example, a wiring material used in semiconductor processing, such as tungsten (W), tungsten nitride (WN), titanium nitride (TiN), or tantalum nitride (TaN).

The storage layer 212 has a stacked structure including an ion source layer 212A provided on the side of the upper electrode 213, and a resistance change layer 212B provided on the side of the lower electrode 211. In this example, an interlayer insulating film 214 is provided between the storage layer 212 and both the lower electrode 211 and the insulating film 215. The storage layer 212 (or the resistance change layer 212B) and the lower electrode 211 are formed so as to make contact with each other in an opening of the interlayer insulating film 214. In the storage layer 212, its resistance state is reversibly changed according to a polarity of a voltage applied between the lower electrode 211 and the upper electrode 213, although a detail thereof will be described later.

The ion source layer 212A contains elements that become movable ions (positive and negative ions) diffusing in the resistance change layer 212B. As ion conductive materials to be negatively ionized, the ion source layer 212A may contain, for example, oxygen (O) and one or more of chalcogen elements including sulfur (S), selenium (Se), and tellurium (Te). In addition, as transition metal elements having an ability to be positively ionized, the ion source layer 212A may contain, for example, one or more of metal elements: in Group 4

(titanium group) including titanium (Ti), zirconium (Zr), and hafnium (Hf); in Group 5 (vanadium group) including vanadium (V), niobium (Nb), and tantalum (Ta); and in Group 6 (chromium group) including chromium (Cr), molybdenum (Mo), and tungsten (W). During the writing operation, these transition metal elements, which have an ability to be positively ionized, are reduced on the cathode electrode to create a conductive path (filament) in a metal state. The creation of this conductive path acts to change the resistance state of the storage device 21.

The resistance change layer 212B has a function of stabilizing a property of retaining information by acting as a conductive barrier, and may be made of, for example, a material having a higher resistance than that of the ion source layer 212A. The constituent material of the resistance change layer 212B may be, for example, an oxide or a nitride containing one or more of: a rare earth element including gadolinium (Gd); a representative element including aluminum (Al), magnesium (Mg), and silicon (Si); and a transition metal element including tantalum (Ta) and copper (Cu).

The upper electrode 213 is provided at the other end of the storage device 21, and is connected to the source line SL. The upper electrode 213 may be made of a known semiconductor wiring material, similar to the lower electrode 211. Among such semiconductor wiring materials, in particular, one that is stable enough not to react with the ion source layer 212A through the post annealing is preferred.

With the configuration as described above, the storage unit 1 performs the writing operation on the memory cell 20 to be driven, causing the storage device 21 of the memory cell 20 to enter the low-resistance state. In turn, the storage unit 1 performs the erasing operation on the memory cell 20, causing the storage device 21 of the memory cell 20 to enter the high-resistance state. Then, the storage device 21 holds information by maintaining the low or high resistance state. In the case where during the erasing operation, the resistance state of the storage device 21 does not sufficiently become the high resistance state (or if a conductance of the storage device 21 does not sufficiently decrease) in the wake of the erasing process, the storage unit 1 temporarily sets the resistance state of the storage device 21 to be an intermediate state between the high-resistance and low-resistance states. Then, the storage unit 1 performs the erasing process again, as will be described later.

Herein, the low-resistance state and the high-resistance state correspond to concrete examples of a "first state" and a "second state," respectively, in an embodiment of the present disclosure. In addition, a writing pulse Ww and an erasing pulse We correspond to concrete examples of a "first pulse" and a "second pulse," respectively, in an embodiment of the present disclosure. Furthermore, a pre-erasing pulse Wpre corresponds to a concrete example of a "third pulse" in an embodiment of the present disclosure.

(Operation and Function)

Next, a description will be given of an operation and a function of the storage unit 1 according to the present embodiment.

(Outline of Overall Operation)

First, a description will be given of an overall operation performed by the storage unit 1, with reference to FIG. 1. The word line driving section 31 applies the signal to the word line WL, thereby selecting the memory cell 20 to be driven. The bit/source line driving section 32 applies the signal to the bit line BL and the source line SL, thereby writing information to each memory cell 20, and erasing and reading the information therefrom. As a result, the memory cell 20 to be driven is selected from the plurality of memory cells 20 in the memory array 10, and the information writing, erasing, and reading operations are selectively performed.

(Trial Production)

A production sample of the memory cell 20 (see FIG. 2) including the storage device 21 as depicted in FIG. 3 was prepared. In the production sample of the storage device 21, the lower electrode 211 and the upper electrode 213 were made of titanium nitride (TiN) and titanium (Ti)/aluminum (Al), respectively. The insulating film 215 was made of tetraethoxysilane (TEOS)-silicon dioxide ($SiO_2$). The interlayer insulating film 214 was formed to have a thickness of 8 nm, and the opening of the interlayer insulating film 214 which was in the vicinity of the lower electrode 211 was formed to have an area of 400 $nm^2$. The ion source layer 212A and the resistance change layer 212B were made of hafnium tellurium oxide (HfTeO) and aluminum oxide (AlO), respectively. The ratio of gate width W to the gate length L of the selection transistor 22 was set to 0.8.

As for the memory cell 20 manufactured in the above manner, respective characteristics of the information writing, erasing, and reading operations were evaluated.

Figure 4:
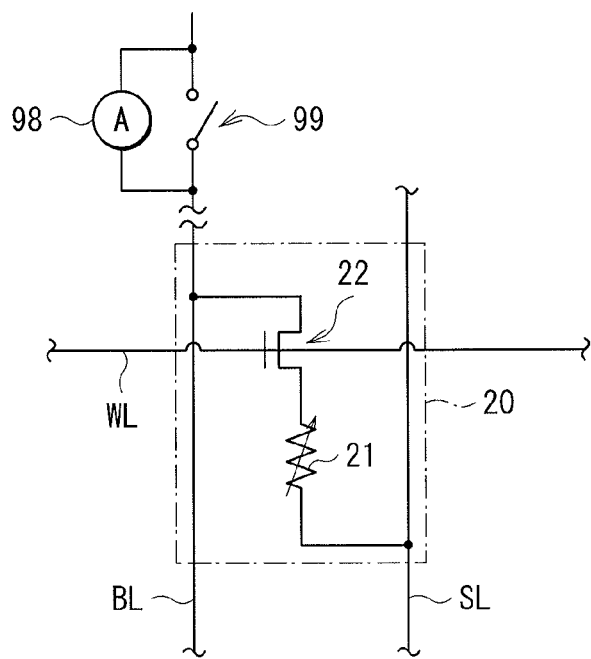
FIG. 4 is a circuit diagram illustrating an evaluation circuit for a memory cell in FIG. 2.

FIG. 4 depicts an exemplary evaluation circuit used for the characteristic evaluation. In FIG. 4, the storage device 21 is depicted as a variable resistor. In this example, an ampere meter 98 and a switch 99 connected in parallel to each other were connected to the bit line BL, as depicted in FIG. 4. While the switch 99 was in an on state, a signal was supplied to the bit line BL from the exterior. In turn, while the switch 99 was in an off state, a current flowing through the storage device 21 of the memory cell 20 was measured.

Next, a description will be given in detail, of the writing, reading, and erasing operations.

Parts (A), (B), and (C) of FIG. 5 depict an exemplary process (writing process PCw) performed in the writing operation. Specifically, Parts (A), (B), and (C) depict waveforms of a word line voltage VWL, a bit line voltage VBL, and a source line voltage VSL, respectively. FIG. 6 depicts a state of the memory cell 20 in the writing process PCw. During the writing process PCw, the switch 99 is kept in the off state in the evaluation circuit.

In the writing process PCw, first, both the bit line voltage VBL and the source line voltage VSL are set to a voltage Vw (for example, 3.5 V) (see Parts (B) and (C) of FIG. 5). Subsequently, the word line voltage VWL is varied from 0 V to a voltage Vgw (for example, 2.2 V) (see Part (A) of FIG. 5). In response, the selection transistor 22 is turned on. Then, the bit line voltage VBL is set to 0 V only during a period Pw (its time span is, for example, 1 msec) (see the writing pulse Ww in Part (B) of FIG. 5). As a result, the voltage Vw is applied between both ends of the storage device 21 during the period Pw, thereby causing the storage device 21 to enter the low-resistance state. Further, a current Iw flows from the source line SL to the bit line BL through the storage device 21, as depicted in FIG. 6. After that, the bit line voltage VBL is returned to the voltage Vw (see Part (B) of FIG. 5), and the word line voltage VWL is varied from the voltage Vgw to 0 V (see Part (A) of FIG. 5).

Parts (A), (B), and (C) of FIG. 7 depict an exemplary process (reading process PCr) performed in the reading operation. Specifically, Parts (A), (B), and (C) depict waveforms of the word line voltage VWL, the bit line voltage VBL, and the source line voltage VSL, respectively. FIG. 8 depicts a state of the memory cell 20 in the reading process PCr. During the reading process PCr, the switch 99 is kept in the off state in the evaluation circuit.

In the reading process PCr, first, both the bit line voltage VBL and the source line voltage VSL are set to a voltage Vr (for example, 0.3 V) (see Parts (B) and (C) of FIG. 7). Subsequently, the word line voltage VWL is varied from 0 V to a voltage VDD (see Part (A) of FIG. 7). In response, the selection transistor 22 is turned on. Then, the bit line voltage VBL is set to 0 V only during a period Pr (see the reading pulse Wr in Part (B) of FIG. 7). As a result, the voltage Vr is applied between both ends of the storage device 21 during the period Pr, thereby allowing a current Ir to flow from the source line SL to the bit line BL through the storage device 21, according to the state (the low-resistance state or the high-resistance state) of the storage device 21, as depicted in FIG. 8. The current Ir is detected by the ampere meter 98. The storage device 21 provides the stored information based on the detected current. After that, the bit line voltage VBL is returned to the voltage Vr (see Part (B) of FIG. 7), and the word line voltage VWL is varied from the voltage VDD to 0 V (see Part (A) of FIG. 7).

FIG. 9 depicts an example of the erasing operation with a flowchart. This erasing operation includes an erasing process PCe, a reading process PCr, and a pre-erasing process PCpre. Hereinafter, this erasing operation will be described in detail.

In the erasing operation, first, the erasing process PCe is performed at Step S1.

Parts (A), (B), and (C) of FIG. 10 depict an example of the erasing process PCe. Specifically, Parts (A), (B), and (C) depict waveforms of the word line voltage VWL, the bit line voltage VBL, and the source line voltage VSL, respectively. FIG. 11 depicts a state of the memory cell 20 in the erasing process PCe. During the erasing process PCe, the switch 99 is kept in the on state in the evaluation circuit.

In the erasing process PCe, first, both the bit line voltage VBL and the source line voltage VSL are set to 0 V (see Parts (B) and (C) of FIG. 10). Subsequently, the word line voltage VWL is varied from 0 V to a voltage Vge (for example, 3.5 V) (see Part (A) of FIG. 10). In response, the selection transistor 22 is turned on. Then, the bit line voltage VBL is set to a voltage Ve (for example, 3 V) only during a period Pe (its time span is, for example, 10 msec) (see the erasing pulse We in Part (B) of FIG. 10). Specifically, in the erasing process PCe, a pulse having the opposite polarity to that of the writing pulse Ww (see FIG. 5) is applied to the bit line BL. As a result, the voltage Ve is applied between both ends of the storage device 21 during the period Pe, thereby causing the storage device 21 to enter the high-resistance state. Further, a current Ie flows from the bit line BL to the source line SL through the storage device 21, as depicted in FIG. 11. After that, the bit line voltage VBL is returned to 0 V (see Part (B) of FIG. 10), and the word line voltage VWL is varied from the voltage Vge to 0 V (see Part (A) of FIG. 10).

At Step S2, the reading process PCr is performed. The reading process PCr is performed in substantially the same manner as that for the reading process PCr depicted in FIGS. 7 and 8.

At Step S3, the conductance G is acquired based on the current Ir measured in the reading process PCr at Step S2, and the conductance G is compared with a preset threshold Gth.

If the acquired conductance G is equal to or higher than the threshold Gth ("N" at Step S3), the pre-erasing process PCpre, which will be described below, is performed at Step S4. Specifically, when the acquired conductance G is equal to or higher than the threshold Gth, it is determined that the information has not been sufficiently erased from the storage device 21, and the erasing operation proceeds to Step S4.

Parts (A), (B), and (C) of FIG. 12 depict an example of the pre-erasing process PCpre. Specifically, Parts (A), (B), and (C) depict waveforms of the word line voltage VWL, the bit line voltage VBL, and the source line voltage VSL, respectively. FIG. 13 depicts a state of the memory cell 20 in the pre-erasing process PCpre. During the pre-erasing process PCpre, the switch 99 is kept in the on state in the evaluation circuit.

In the pre-erasing process PCpre, first, both the bit line voltage VBL and the source line voltage VSL are set to a voltage Vpre (for example, 3.5 V) (see Parts (B) and (C) of FIG. 12). Subsequently, the word line voltage VWL is varied from 0 V to a voltage Vgpre (for example, 2.5 V) (see Part (A) of FIG. 12). In response, the selection transistor 22 is turned on. Then, the bit line voltage VBL is set to 0 V only during a period Ppre (its time span is, for example, 1 nsec) (see the pre-erasing pulse Wpre in Part (B) of FIG. 12). Specifically, in the pre-erasing process PCpre, a pulse having the opposite polarity to that of the erasing pulse We (see FIG. 10) is applied to the bit line BL. In other words, in the pre-erasing process PCpre, a pulse having the same polarity as that of the writing pulse Ww (see FIG. 5) is applied to the bit line BL. As a result, the voltage Vpre is applied between both ends of the storage device 21 during the period Ppre, thereby setting the resistance state of the storage device 21 to an intermediate state between the high-resistance and low-resistance states, as will be described later. Further, a current Ipre flows from the source line SL to the bit line BL through the storage device 21, as depicted in FIG. 13. After that, the bit line voltage VBL is returned to the voltage Vpre (see Part (B) of FIG. 12), and the word line voltage VWL is varied from the voltage Vgpre to 0 V (see Part (A) of FIG. 12).

After the pre-erasing process PCpre is performed, the erasing operation returns to Step S1, and the erasing process (Step S1) and the reading process (Step S2) are performed again. Then, a processing loop L of Steps S1 to S4 is repeated until the conductance G becomes lower than the threshold Gth.

On the other hand, if the acquired conductance G is lower than the threshold Gth ("Y" at Step S3), the erasing operation terminates this processing flow. Thus, when the acquired conductance G is lower than the threshold Gth, it is determined that the information has been sufficiently erased from the storage device 21, and the erasing operation is terminated.

FIG. 14 depicts an exemplary waveform of a voltage ΔV (=bit line voltage VBL−source line voltage VSL) between both ends of the storage device 21, during the erasing operation. FIG. 15 depicts an example of the conductance G of the storage device 21 in the wake of each process of the erasing operation, as depicted in FIG. 14. In this example, the processing loop L of Steps S1 to S4 is repeated three times during the erasing operation.

First, a first erasing process PCe(1) (Step S1) is performed, and the erasing pulse We having a positive polarity is applied to the storage device 21, as depicted in FIG. 14. Subsequently, a first reading process PCr(1) (Step S2) is performed, and the reading pulse Wr having a negative polarity is applied. In this example, the read conductance G is equal to or higher than the threshold Gth (Step S3), as depicted in FIG. 15. Accordingly, a first pre-erasing process PCpre(1) (Step S4) is performed, and the pre-erasing pulse Wpre having a negative polarity is applied. Consequently, the resulting conductance G corresponds to the intermediate state between the high-resistance and low-resistance states, as depicted in FIG. 15.

After that, a second erasing process PCe(2), a second reading process PCr(2), and a second pre-erasing process PCpre(2) are performed in the same manner.

Furthermore, a third erasing process PCe(3) (Step S1) is performed, and a third reading process PCr(3) (Step S2) is performed. In this example, the read conductance G is lower than the threshold Gth (Step S3), as depicted in FIG. 15.

Therefore, the processing loop L of Steps S1 to S4 is terminated, and the erasing operation is also terminated.

As described above, the storage unit 1 first performs the erasing process PCe during the erasing operation. If the conductance G does not sufficiently decrease in the wake of the erasing process PCe, the storage unit 1 performs the pre-erasing process PCpre, and then performs the erasing process PCe again. The verification is conducted in this manner, thereby making it possible to sufficiently decrease the conductance G and to sufficiently erase the information from the storage device 21.

(The Number of Rewritable Times)

Next, a description will be given of a variation in the conductance G of the storage device 21, when the writing and erasing operations are alternately performed.

FIG. 16 depicts an exemplary operation when the writing and erasing operations are alternately performed, with a flowchart. In this evaluation, the storage unit 1 repeatedly performed a series of operations, including a writing operation C1, a reading operation C2, an erasing operation C3, and a reading operation C4. Then, the storage unit 1 obtained the conductance G of the storage device 21 in the wake of the writing operation C1, during the reading operation C2. Likewise, the storage unit 1 obtained the conductance G of the storage device 21 in the wake of the erasing operation C3, during the reading operation C4. Note that in the evaluation, the upper limit of the number of times which the processing loop L was repeated during the erasing operation C3 was set to 20, and if the number of repeated times exceeded 20, the evaluation proceeded to the reading operation C4, regardless of conductance G.

FIG. 17 depicts the conductance G in the operation of FIG. 16. The example indicates a variation in the conductance G obtained when the series of operations, including the writing operation C1 to the reading operation C4, is repeated 1000 times. The higher conductances G corresponded to those obtained in the reading operation C2 following the writing operation C1, whereas the lower conductances G corresponded to those obtained in the reading operation C4 following the erasing operation C3.

FIG. 17 reveals that the storage unit 1 maintains the high conductance G in the wake of the writing operation C1 and the low conductance G in the wake of the erasing operation C3, independently of the number of operation times. Thus, the storage unit 1 sufficiently secures a difference in conductance G between the high-resistance and low-resistance states, even when the information is rewritten thereto. In conclusion, the storage unit 1 enables the information stored in the memory cells 20 to be read stably by reducing a risk of erroneously discriminating between the two states, thus increasing the number of rewritable times.

As described above, during the erasing operation C3, the storage unit 1 first acquires the conductance G after performing the erasing process PCe once, and then repeatedly performs the pre-erasing process PCpre and the erasing process PCe until the acquired conductance G sufficiently decreases. Conducting the verification in this manner enables the number of rewritable times to be increased, as will be described in comparison with comparative examples.

The number of rewritable times is dependent on the duration Ppre and the current Ipre of the pre-erasing pulse Wpre used in the pre-erasing process PCpre. For example, the current Ipre may be set by adjusting the voltage Vgpre or Vpre of FIG. 12. Next, a description will be given of a relationship between the number of rewritable times and these driving parameters used in the pre-erasing process PCpre.

FIG. 18 indicates the number of rewritable times when each of the duration Ppre and the current Ipre of the pre-erasing pulse Wpre is arbitrarily set. Here, the number of rewritable times represents the maximum number of rewritable times which assures that at least a predetermined degree of difference in conductance G is secured between the high-resistance and low-resistance states. In FIG. 18, the number of the maximum rewritable times is expressed in an arbitrary unit. Note that in FIG. 18, data in which the sufficient difference in conductance G is secured between the high-resistance and low-resistance states is indicated as the number of rewritable times of 100, for the sake of convenience.

FIG. 18 reveals that the number of rewritable times is increased when the duration of the pre-erasing pulse Wpre is decreased. In more detail, it is possible to increase the number of rewritable times by decreasing the duration of the pre-erasing pulse Wpre and increasing the current Ipre. One reason for this is as follows. After the storage unit 1 performs the erasing process PCe, the storage device 21 is in the high-resistance state, and does not allow a large current to flow therethrough. Accordingly, the storage unit 1 performs the pre-erasing process PCpre so as to slightly decrease the resistance of the storage device 21. As a result, the storage device 21 allows a slightly larger current to flow therethrough. Further, the storage unit 1 performs the erasing process PCe again so that the storage device 21 is in a higher resistance state.

Moreover, it is possible to optimize the duration Ppre and the current Ipre of the pre-erasing pulse Wpre, based on the comparison with the driving parameters (pulse duration=1 µsec, current Iw=90 µA) of the writing process PCw during which the pulse having the same polarity as that of the pre-erasing process PCpre is applied. Specifically, it is possible to increase the number of rewritable times by setting the duration of the pre-erasing pulse Wpre to be shorter than that of the writing pulse We and setting the current Ipre to be larger than the current Iw in the writing process PCw.

Next, a description will be given of a function of the present embodiment, in comparison with comparative examples.

Comparative Example 1

In a comparative example 1, the verification (processing loop L) of FIG. 9 was not performed during the erasing operation. In other words, the erasing process PCe was simply performed only once during the erasing operation. Another part of the comparative example 1 was the same as that of the present embodiment (see FIG. 16, etc.).

FIG. 19 depicts an exemplary operation performed by a storage unit 1R according to the comparative example 1. In this example, the storage unit 1R repeatedly performed a series of operations, including the writing operation C1, the reading operation C2, an erasing operation R3, and the reading operation C4. The storage unit 1R performed only the erasing process PCe during the erasing operation R3. As for the erasing operation C3 according to the present embodiment, the storage unit 1 first acquired the conductance G after performing the erasing process PCe once, and then repeatedly performed the pre-erasing process PCpre and the erasing process PCe until the conductance G sufficiently decreased. In contrast, as for the erasing operation R3 according to the comparative example 1, the storage unit 1R performed the erasing process PCe only once.

FIG. 20 depicts the conductance G in the operation of FIG. 19. FIG. 20 reveals that the conductance G in the wake of the erasing operation R3 rapidly increased after the series of operations was conducted about six times, and became substantially the same as that in the wake of the writing operation C1. Therefore, it was difficult to discriminate between the high-resistance and low-resistance states.

Comparative Example 2

In a comparative example 2, the pre-erasing process PCpre of FIG. 9 was omitted during the erasing operation. Another part of the comparative example 2 was the same as that of this embodiment (see FIG. 16, etc.).

FIG. 21 depicts an exemplary operation performed by a storage unit 1S according to the comparative example 2. In this example, the storage unit 1S repeatedly performed a series of operations, including the writing operation C1, the reading operation C2, an erasing operation S3, and the reading operation C4. During the erasing operation S3, the storage unit 1S first acquired the conductance G after performing the erasing process PCe once, and then repeated the erasing process PCe until the acquired conductance G sufficiently decreased. As for the erasing operation C3 according to the present embodiment, the storage unit 1 repeatedly performed the pre-erasing process PCpre and the erasing process PCe until the conductance G sufficiently decreased. In contrast, as for the erasing operation S3 according to the comparative example 2, the storage unit 1S repeatedly performed only the erasing process PCe until the conductance G sufficiently decreased.

FIG. 22 depicts the conductance G in the operation of FIG. 21. In this evaluation, an upper limit of the number of times which a processing loop L of the erasing operation S3 was repeated was set to 20, and when the number of repeated times exceeded 20, the series of operation proceeded to the reading operation C4, regardless of conductance G. FIG. 22 reveals that every time the series of operations were performed, the conductance G in the wake of the erasing operation S3 gradually increased and the difference in conductance G gradually decreased between the high-resistance and low-resistance states.

In the comparative examples 1 and 2, as described above, repeating the writing operation C1 and the erasing operation R3 or S3 decreases the difference in conductance G between the high-resistance and low-resistance states, thereby making it difficult to discriminate therebetween. This may result in the decrease in the number of rewritable times.

In contrast, the storage unit 1 according to the present embodiment, during the erasing operation, first acquires the conductance G after performing the erasing process PCe once, and then repeatedly performs the pre-erasing process PCpre and the erasing process PCe until the conductance G sufficiently decreases. Therefore, the storage unit 1 enables the difference in conductance G to be sufficiently secured between the high-resistance and low-resistance states, even when repeating the writing operation C1 and the erasing operation C3. This results in the increase in the number of rewritable times.

[Effect]

As described above, the storage unit 1 according to the present embodiment performs the pre-erasing process with the pre-erasing pulse having the same polarity as that of the writing pulse, and then performs the erasing process, during the erasing operation. Consequently, the number of rewritable times is successfully increased.

Furthermore, the storage unit 1 according to the present embodiment first acquires the conductance after performing the erasing process once, and then repeatedly performs the pre-erasing process PCpre and the erasing process PCe until the conductance G sufficiently decreases. Consequently, the number of rewritable times is also successfully increased.

Up to this point, the present technology has been described by exemplifying the above embodiment. However, the present technology is not limited to the embodiment, and various modifications thereof may be contemplated.

For example, another resistance change type of storage device, such as a single-layer-structured transition metal oxide type of storage device, may be used, instead of the stack-structured storage device 21 provided with the ion source layer 212A and the resistance change layer 212B as in the above embodiment.

Note that an embodiment of the present disclosure may also include the following configuration.

(1) A storage unit including:

a storage device configured to store a resistance state, the resistance state being changeable between a first state and a second state; and a driving section, when setting the resistance state to the first state, applying a first pulse having a first polarity to the storage device, the driving section, when setting the resistance state to the second state, applying a second pulse having a second polarity to the storage device, then temporarily applying a third pulse having the first polarity, and applying the second pulse again, the first polarity and the second polarity differing from each other.

(2) The storage unit according to (1), wherein the driving section temporarily applies the third pulse, when a predetermined condition is not satisfied after the application of the second pulse.

(3) The storage unit according to (2), wherein the first state is a low-resistance state, and the second state is a high-resistance state.

(4) The storage unit according to (3), wherein the predetermined condition is that a resistance of the storage device exceeds a predetermined threshold.

(5) The storage unit according to any one of (2) to (4), wherein the driving section repeats alternately the application of the third pulse and the application of the second pulse, until the predetermined condition is satisfied.

(6) The storage unit according to any one of (2) to (5), wherein the driving section applies a fourth pulse having the first polarity to obtain a conductance of the storage device, and determines whether or not the predetermined condition is satisfied, based on the conductance.

(7) The storage unit according to any one of (1) to (6), wherein a duration of the third pulse is shorter than a duration of the first pulse.

(8) The storage unit according to any one of (1) to (7), wherein a current flowing through the storage device to which the third pulse is applied is larger than a current flowing through the storage device to which the first pulse is applied.

(9) The storage unit according to any one of (1) to (8), wherein the storage device includes a first electrode, a second electrode provided opposite the first electrode, and a storage layer interposed between the first electrode and the second electrode, and the driving section applies the first pulse, the second pulse, or the third pulse, as an electric potential difference between the first electrode and the second electrode.

(10) The storage unit according to (9), wherein the storage layer includes a resistance change layer and an ion source layer.

(11) The storage unit according to (10), wherein
the ion source layer contains one or more chalcogen elements and one or more transition metal elements.

(12) The storage unit according to (11), wherein
the storage device changes to the low-resistance state by ionizing the transition metal elements, then moving the ionized transition metal elements from the ion source layer to the resistance change layer, and creating a conductive path when the predetermined electric potential difference is applied between the first electrode and the second electrode.

(13) The storage unit according to (11) or (12), wherein
the one or more chalcogen elements include sulfur (S), selenium (Se), or tellurium (Te), and
the one or more transition metal elements include titanium (Ti), zirconium (Zr), hafnium (Hf), vanadium (V), niobium (Nb), tantalum (Ta), chromium (Cr), molybdenum (Mo), or tungsten (W).

(14) The storage unit according to any one of (10) to (13), wherein
the ion source layer contains oxygen.

(15) The storage unit according to (9), wherein
the storage layer is made of a transition metal oxide.

(16) A driving method including:
when setting a resistance state of a storage device to a first state, applying a first pulse having a first polarity to the storage device, the resistance state being changed between the first state and a second state; and
when setting the resistance state to the second state, applying a second pulse having a second polarity to the storage device, then temporarily applying a third pulse having the first polarity, and applying the second pulse again, the first polarity and the second polarity differing from each other.

The present disclosure contains subject matter related to that disclosed in Japanese Priority Patent Application JP 2012-180285 filed in the Japan Patent Office on Aug. 15, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A storage unit comprising:
a storage device configured to store a resistance state, the resistance state being changeable between a first state and a second state; and
a driving section, in an event of setting the resistance state to the first state, configured to apply a first pulse having a first polarity to the storage device,
the driving section, in an event of setting the resistance state to the second state, configured to apply a second pulse having a second polarity to the storage device,
wherein subsequent to the application of the second pulse, the driving section is configured to apply a third pulse having the first polarity and the second pulse again,
wherein the first polarity and the second polarity are different from each other, and
wherein the first state is a low-resistance state and the second state is a high-resistance state.

2. The storage unit according to claim 1, wherein the driving section is configured to apply the third pulse, in an event a predetermined condition is not satisfied after the application of the second pulse.

3. The storage unit according to claim 1,
wherein the driving section is configured to apply the third pulse, in an event a predetermined condition is not satisfied after the application of the second pulse, and
wherein the predetermined condition is that a resistance of the storage device exceeds a predetermined threshold.

4. The storage unit according to claim 3, wherein the driving section is configured to repeat alternately the application of the third pulse and the application of the second pulse, until the predetermined condition is satisfied.

5. The storage unit according to claim 3, wherein the driving section is configured to apply a fourth pulse having the first polarity to obtain a conductance of the storage device, and determine whether or not the predetermined condition is satisfied, based on the conductance.

6. The storage unit according to claim 1, wherein a duration of the third pulse is shorter than a duration of the first pulse.

7. The storage unit according to claim 1, wherein a first current flowing through the storage device in an event the third pulse is applied is larger than a second current flowing through the storage device in an event the first pulse is applied.

8. The storage unit according to claim 1, wherein
the storage device includes a first electrode, a second electrode provided opposite the first electrode, and a storage layer interposed between the first electrode and the second electrode, and
the driving section is configured to apply the first pulse, the second pulse, or the third pulse, as an electric potential difference between the first electrode and the second electrode.

9. The storage unit according to claim 8, wherein the storage layer includes a resistance change layer and an ion source layer.

10. The storage unit according to claim 9, wherein the ion source layer contains one or more chalcogen elements and one or more transition metal elements.

11. The storage unit according to claim 10, wherein the storage device changes to the low-resistance state by ionizing the one or more transition metal elements, then moving the ionized one or more transition metal elements from the ion source layer to the resistance change layer, and creating a conductive path in an event the electric potential difference is applied between the first electrode and the second electrode.

12. The storage unit according to claim 10, wherein the one or more chalcogen elements include sulfur (S), selenium (Se), or tellurium (Te), and the one or more transition metal elements include titanium (Ti), zirconium (Zr), hafnium (Hf), vanadium (V), niobium (Nb), tantalum (Ta), chromium (Cr), molybdenum (Mo), or tungsten (W).

13. The storage unit according to claim 9, wherein the ion source layer contains oxygen.

14. The storage unit according to claim 8, wherein the storage layer is made of a transition metal oxide.

15. A driving method comprising:
in an event of setting a resistance state of a storage device to a first state, applying a first pulse having a first polarity to the storage device, the resistance state being changed between the first state and a second state;
in an event of setting the resistance state to the second state, applying a second pulse having a second polarity to the storage device; and
subsequent to the application of the second pulse, applying a third pulse having the first polarity and applying the second pulse again, wherein the first polarity and the second polarity are different from each other, wherein the first state is a low-resistance state, and the second state is a high-resistance state.

16. A storage unit comprising:

a storage device configured to store a resistance state, the resistance state being changeable between a low resistance state and a high resistance state; and a driving section, in an event of setting the resistance state to the low resistance state, configured to apply a first pulse having a negative polarity to the storage device, the driving section, in an event of setting the resistance state to the high resistance state, configured to apply a second pulse having a positive polarity to the storage device, wherein subsequent to the application of the second pulse, the driving section is configured to apply a third pulse having the negative polarity and the second pulse again having the positive polarity, and wherein the driving section in an event of setting the resistance state to the high resistance state is configured to:

apply a fourth pulse, having the negative polarity, after the second pulse to obtain conductance of the storage device, and determine whether or not a predetermined condition is satisfied based on the conductance after the application of the second pulse.

* * * * *